Feb. 5, 1957    J. L. BOYER ET AL    2,780,759

SEMICONDUCTOR RECTIFIER DEVICE

Filed Aug. 18, 1955

INVENTORS
John L. Boyer &
August P. Colaiaco.
BY
F. P. [signature]
ATTORNEY

United States Patent Office 2,780,759

Patented Feb. 5, 1957

2,780,759

SEMICONDUCTOR RECTIFIER DEVICE

John L. Boyer, Forest Hills, and August P. Colaiaco, Penn Township, Allegheny County, Pa., assignors to Westinghouse Electric Corporation, East Pittsburgh, Pa., a corporation of Pennsylvania Application August 18, 1955, Serial No. 529,304

7 Claims. (Cl. 317—234)

The present invention relates to semiconductor rectifier devices, and more particularly to a sealed power rectifier of the P–N junction type.

Semiconductor materials suitable for use in rectifiers, such as germanium and silicon, may be of either of two conductivity types. N-type material is characterized by an excess of electrons, and conduction takes place because of the presence of these electrons. P-type material is characterized by a deficiency of electrons in the crystal structure of the material, resulting in so-called holes in the valence bonds between adjacent atoms, and conduction takes place by means of an apparent movement of these holes, which act like positive charges. Semiconductor materials of either of these conductivity types can be produced by adding very small amounts of certain impurities to the pure materials. These impurities may be donor impurities which contribute excess electrons, resulting in N-type material, or they may be acceptor impurities which lack the neecssary electrons to complete the valance bonds, resulting in P-type material. These materials have rectifying properties and, in particular, if a body of semiconductor material has adjoining zones of N-type and P-type material, the junction between these zones acts as a rectifying layer or barrier, which has low impedance to current flow from the P-type to the N-type material but very high impedance to current flow from the N-type to the P-type material.

These P–N junction rectifiers have very desirable characteristics, since they are capable of withstanding relatively high reverse voltages and can carry high current densities in the forward direction with good efficiency. These devices, therefore, are suitable for use as power rectifiers and can handle relatively large amounts of power if the rectifying junction is made of sufficient area.

In the actual construction of large-area P–N junction power rectifiers, however, certain practical problems are involved. The semiconductor material must be made as thin as possible, to keep the forward resistance low, but both germanium and silicon are relatively brittle materials, and when cut into thin wafers of large area as compared to the thickness, the wafers are very fragile and are easily broken. It is necessary, therefore, to design the rectifier assembly in such a manner that the semiconductor material is adequately supported and is protected from being subjected to any appreciable mechanical stresses, in order to prevent breakage of the material.

It is also necessary to provide for the best possible heat transfer from the semiconductor material to prevent excessive temperature rise. These materials have quite definite temperature limits which must not be exceeded, since if the temperature gets too high, the reverse impedance of the rectifying junction rapidly decreases, resulting in increased leakage currents with increased heating and damage to the rectifier. Very effective cooling must therefore be provided to obtain high current ratings without exceeding the maximum permissible temperature.

Semiconductor materials are also very sensitive to moisture, and the presence of even a very small amount of moisture near the rectifying junction greatly increases the leakage current, with resultant overheating and damage. These devices are also quite sensitive to many other impurities, and any such impurity or contaminant which may reach the rectifier cell has a very damaging effect on the characteristics of the rectifier or may adversely affect the life of the device. It is necessary, therefore, to seal or encapsulate the rectifier to adequately protect it against moisture and other impurities.

Semiconductor rectifier cells have been encapsulated in plastic materials, but this is not satisfactory because such materials do not reliably maintain an air-tight seal for long periods of time, and also make it difficult to adequately cool the rectifier for high current ratings. It has also been proposed to enclose semiconductor rectifier cells in sealed enclosures with soldered or brazed joints. Such a construction provides adequate sealing, but impurities are frequently introduced into the enclosure during the sealing process itself from the fluxes or other materials necessarily used in the soldering or brazing operations.

It will be seen, therefore, that the design of a practical semiconductor power rectifier involves numerous difficult problems because of the necessity of a hermetic enclosure for the rectifier cell which will protect it from moisture and other impurities and which can be sealed without introducing impurities in the sealing process. The enclosure must also include sufficient flexibility to protect the fragile semiconductor material against substantial mechanical stresses, and must also provide means for adequately cooling the rectifier cell.

The principal object of the present invention is to provide a hermetically sealed semiconductor rectifier device in which the rectifier cell itself is effectively protected against moisture and other impurities by a sealed enclosure which can readily be made free of all impurities before sealing and sealed without introducing any impurities, and in which the rectifier cell is adequately protected against mechanical stresses and is effectively cooled.

Another object of the invention is to provide a sealed semiconductor rectifier device in which the rectifier cell is contained in a sealed enclosure which is designed so that all internal surfaces can easily be completely and effectively cleaned before assembly, so that no impurities remain in the enclosure, and in which the final seals in the assembly of the device are made by welding so that no impurities are introduced in the sealing operation.

A further object of the invention is to provide a sealed semiconductor rectifier device in which a flexible conductor is attached to one terminal of a rectifier cell to provide for carrying heavy currents without subjecting the rectifier cell to appreciable stresses, and in which the rectifier cell is sealed in a hermetic enclosure for protection against moisture and other impurities, the enclosure being so arranged that the flexible conductor is outside the sealed enclosure, so that all surfaces within the enclosure are easily cleaned before assembly to remove all impurities, and the enclosure itself providing sufficient flexibility to prevent substantial mechanical stresses from being applied to the rectifier cell by handling of the device.

The invention will be more fully understood from the following detailed description, taken in connection with the accompanying drawing, in which.

The present invention, as previously indicated, provides a hermetically sealed power rectifier device. The construction of this device is somewhat similar to that disclosed and claimed in our copending application, Serial No. 404,086, filed January 14, 1954. The present invention, however, provides an improved construction of this general type in which the rectifier cell is contained in a sealed enclosure which can readily be made free of impurities before final sealing, and which is sealed in such a manner that no impurities are introduced by the sealing operation itself, which is difficult to prevent when soldered or brazed joints are used for the final seal because of the necessity of using fluxes in these sealing operations.

Figure 1:
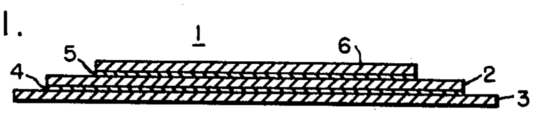
Figure 1 is a sectional view of a typical semi-conductor rectifier cell.

Figure 1 shows the construction of a typical semiconductor rectifier cell suitable for use in the present invention, this cell being of the type disclosed and claimed in the above-mentioned copending application, and the thicknesses of the various components being greatly exaggerated in the drawing for clarity of illustration. The rectifier cell 1 includes a body of semiconductor material 2, which may be either germanium or silicon, and which is preferably a thin wafer cut from a single crystal. The semiconductor 2 is supported on a metal support plate 3, which is preferably made of molybdenum or tungsten, which have good thermal conductivity and thermal expansivities quite close to those of germanium and silicon, so that no stresses are imposed on the semiconductor material by differential expansion when the cell is heated during manufacture or in service. The semiconductor 2 is preferably N-type material and is secured to the support plate 3 by a thin layer of solder 4, which may be pure tin if the semiconductor is germanium, or which may be a suitable solder of higher melting point, such as a silver alloy, if silicon is used.

A thin layer of an acceptor material 5 is applied on the upper surface of the semiconductor material 2. Any suitable acceptor material may be used, indium being preferred if the semiconductor is germanium and aluminum being the preferred material if the semiconductor is silicon. The acceptor material 5 alloys with the semiconductor and diffuses into it, when heated to the proper temperature during manufacture, and converts a portion of the semiconductor to P-type material, thus forming a P–N rectifying junction in the semiconductor. A second support plate 6, preferably also of molybdenum or tungsten, is placed on the layer of acceptor material 5 and is secured in place by the acceptor material. The support plates 3 and 6 provide the necessary physical support for the semiconductor and also serve as electrical terminals for the rectifier cell. It will be understood that any type of semiconductor rectifier cell may be utilized in the assembly described below, and that the particular cell described in detail is only illustrative.

As previously explained, a semiconductor rectifier cell, such as the cell 1 described above, has very desirable characteristics and can handle large amounts of power. For practical use, however, such a rectifier cell must be provided with a suitable supporting and enclosing structure which protects the cell from moisture and other impurities, and protects it from mechanical stresses which might damage the fragile semiconductor material, and which must also provide for very effective cooling to permit high current ratings to be obtained. The present invention provides such a structure which fully meets these requirements and, in particular, provides an effective means for protecting the cell against moisture and other impurities.

Figure 2:
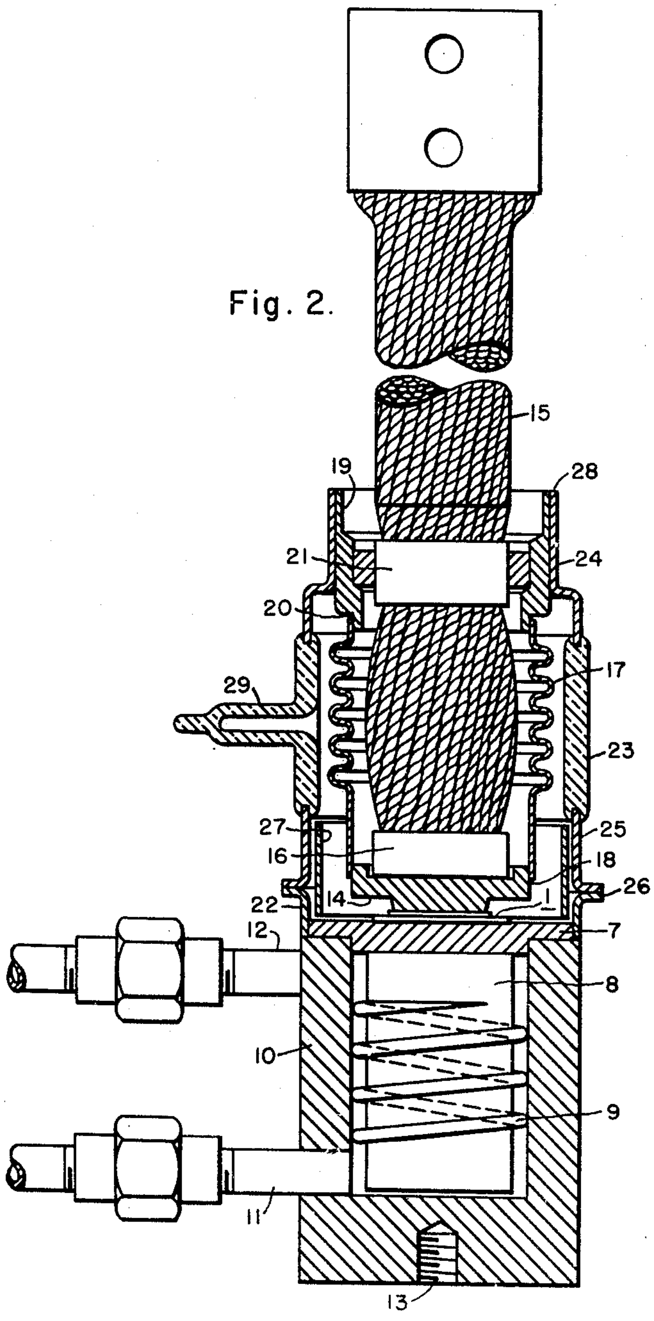
Fig. 2 is a vertical sectional view of a rectifier device embodying the invention.

As shown in Fig. 2, the rectifier cell 1 is mounted on a copper support or terminal member 7, the cell preferably being soldered to the terminal member 7 for good electrical contact and good heat transfer. The terminal member 7 may be of any suitable construction and is preferably provided with cooling means to dissipate the heat which flows from the rectifier cell to the relatively large copper mass of the terminal member. In the particular embodiment shown in the drawing, the terminal member 7 is water cooled, and for this purpose the terminal member includes a relatively massive cylindrical portion 8 which has a helical rib 9 formed thereon. An outer cup-shaped copper member 10 fits snugly over the cylindrical portion 8 of the terminal member and is brazed or otherwise secured to the terminal member 7 at its upper end. Inlet and outlet tubes 11 and 12, respectively, extend through the wall of the outer member 10 and communicate with the helical passage formed by the rib 9 to circulate water therethrough. A tapped hole 13 may be provided in the bottom of the member 10 to provide for mounting the device on a bus bar or other conductor or support.

A second copper terminal member 14 is secured to the other side of the rectifier cell, preferably by soldering to the upper support plate 6 of the cell. A flexible conductor 15 is attached to the terminal member 14 in any suitable manner, as by brazing or soldering a copper collar 16 at the end of the conductor 15 to the terminal member 14. The conductor 15 is shown as being a heavy, multistrand, twisted copper cable, which is capable of carrying currents of the order of hundreds of amperes, while still being sufficiently flexible to prevent imposing mechanical stresses on the semiconductor material of the rectifier cell, due to handling of the rectifier or to an external bus bar to which the conductor 15 may be connected.

In the construction of our copending application mentioned above, a flexible conductor corresponding generally to the conductor 15 is enclosed in the sealed container which encloses the rectifier cell. It has been found that this is undesirable because it is extremely difficult, if not impossible, to thoroughly clean the heavy multistrand conductor so as to completely remove all traces of impurities or contaminants which might have an adverse effect on the rectifier cell if allowed to remain within the sealed enclosure. In accordance with the present invention, a construction is provided in which the flexible conductor is outside the sealed enclosure, and the enclosure is so arranged that all surfaces within the enclosure can readily be cleaned and the final sealing can be performed without introducing any impurities.

A flexible metal bellows 17 is placed over the flexible conductor 15, surrounding the conductor, and the lower end of the bellows is secured to the terminal member 14 with a gas-tight seal, indicated at 18, which may be made by brazing, or in any other suitable manner. A generally cylindrical metal member 19 which may, for example, be made of stainless steel is secured to the upper end of the bellows 17 with a gas-tight seal, indicated at 20, by brazing or other suitable means. The cylindrical member 19 is preferably also attached to an intermediate part of the flexible conductor 15 by soldering or brazing to a copper band 21 secured to the conductor 15. The assembly of the bellows 17 to the terminal member 14 and the member 19 may be completed before attaching the terminal member to the rectifier cell, and the brazed joints at 18 and 20, as well as the surfaces of the bellows and its associated parts are carefully cleaned so that no impurities remain on these surfaces. Since these are all relatively smooth metallic surfaces and brazed joints, the cleaning operation can readily be performed and a very high degree of freedom from impurities obtained.

A metal flange member 22, preferably of stainless steel, is brazed or otherwise secured to the terminal member 7 with a gas-tight seal. This operation is preferably also performed before the rectifier cell 1 is mounted on the terminal member 7, and the brazed joint, and the surfaces of flange 22 and terminal member 7 are thoroughly cleaned so that no impurities remain on these surfaces.

The sealed enclosure is completed by an outer rigid insulating member which preferably consists of a glass tube 23 with cylindrical sleeve members 24 and 25 at each end. The sleeve members 24 and 25 are made of an alloy which is capable of forming a permanent airtight seal with glass, such as the iron-nickel-cobalt alloy known as Kovar, and are fused to the glass tube 23 to form permanent hermetic seals. In the final assembly of the device, after the brazed seals described above have been made and thoroughly cleaned, and all interior surfaces of the outer enclosing member and exterior surfaces of the bellows 17 and its associated parts, have been thoroughly cleaned, the rectifier cell 1 is soldered to the terminal member 7 and the terminal member 14 is soldered to the upper side of the rectifier cell. The outer enclosure member 23 is then placed over the outside of the device, surrounding the bellows 17 as shown in the drawing, and the lower sleeve 25 is welded to the flange member 22 to form a permanent gas-tight seal at 26. A metal shield 27 may be provided adjacent the joint between the flange 22 and sleeve 25 to protect the rectifier cell from the heat of the welding operation and from any impurities which may result from the welding. The final sealing operation is then performed by welding the upper sleeve member 24 to the cylindrical member 19 to form a gas-tight joint at 28, this joint being so far removed physically from the rectifier cell that the welding opeartion cannot damage or contaminate the cell. Thus, the rectifier cell is enclosed in a completely hermetically sealed enclosure formed between the outer glass tube 23 and the flexible bellows 17. After the device has been sealed as described above, the enclosed space is preferably evacuated through a tubulation 29 provided for that purpose in the glass tube 23, and after being evacuated the sealed enclosure may be filed with a dry, inert gas such as argon or helium, after which the tubulation 29 is sealed off.

It will now be apparent that a sealed rectifier construction has been provided in which the rectifier cell is completely enclosed in a hermetically sealed container which protects it against moisture or other impurities. The flexible conductor 15 prevents any substantial mechanical stresses from being applied to the rectifier cell by external bus bars or by handling of the assembly. The band 21 is tightly clamped on the conductor 15 so as to be rigidly secured to it and the band is brazed to the cylindrical member 19. Thus, the conductor 15 is rigidly supported at an intermediate point and any movement, such as bending or twisting, of the upper part of the flexible conductor is not transmitted to the lower part below the band 21. The rectifier cell is therefore fully protected against any stresses being applied to it by the conductor 15. The lower part of the conductor within the bellows 17 is sufficiently flexible to protect the rectifier cell from any stresses due to bending or handling of the complete assembly. In this way, although a single flexible conductor is used, it is in effect divided mechanically into two parts for complete protection of the fragile semiconductor material.

The flexible bellows 17 prevents any bending stresses, or other substantial mechanical stresses from being applied to the cell by handling of the complete assembly. The use of the flexible bellows as part of the sealed enclosure thus makes it possible to exclude the conductor 15 from the enclosure while still providing sufficient flexibility to protect the rectifier cell from mechanical stresses. By excluding the flexible conductor from the sealed enclosure, and by utilizing a structure in which the brazed or soldered joints can readily be cleaned before final assembly, an arrangement is made possible such that substantially all impurities or contaminants are eliminated from the sealed enclosure before sealing and such that the final sealing operations are performed by welding, so that substantially no impurities are introduced by the sealing operation itself. Thus, a construction is provided in which the rectifier cell is fully protected against moisture or contamination and is also adequately protected from mechanical stresses, while very effective cooling is provided for by the direct cooling of the terminal member 7 on which the rectifier cell is directly mounted.

A preferred embodiment of the invention has been shown and described for the purpose of illustration, but it will be apparent that various modifications may be made. Thus, a water cooled construction has been shown but it will be obvious that the terminal member 7 could equally well be air cooled by eliminating the water passage and providing suitable fins or radiating surfaces on the terminal 7 in any desired manner. Similarly, various other modifications and embodiments of the invention will be apparent to those skilled in the art, and it is to be understood that all such embodiments and modifications are within the scope of the invention.

We claim as our invention:

1. A rectifier device comprising a semiconductor rectifier cell, a metal support member, the rectifier cell being mounted on the support member in conductive relation thereto, a flexible conductor connected to the other side of the rectifier cell, and gas-tight enclosing means for the rectifier cell, said enclosing means including a flexible inner member surrounding the flexible conductor and having a gas-tight connection therewith and an insulating, substantially rigid outer member having a gas-tight connection with said support member.

2. A rectifier device comprising a semiconductor rectifier cell, a metal support member, the rectifier cell being mounted on the support member in conductive relation thereto, a flexible conductor connected to the other side of the rectifier cell, and gas-tight enclosing means for the rectifier cell, said enclosing means including a flexible inner member surrounding the flexible conductor and having a gas-tight connection therewith and an insulating, substantially rigid outer member having a gas-tight connection with said support member, and means for dissipating heat from the support member.

3. A rectifier device comprising a first terminal member, a semiconductor rectifier cell attached to said terminal member, a second terminal member attached to the other side of the rectifier cell, a flexible conductor attached to the second terminal member, a flexible member surrounding said conductor and secured to the second terminal member with a gas-tight seal, and an insulating enclosing member joined to the first terminal member and to said flexible member with gas-tight seals to form an enclosure for the rectifier cell.

4. A rectifier device comprising a first terminal member, a semiconductor rectifier cell attached to said terminal member, a second terminal member attached to the other side of the rectifier cell, a flexible conductor attached to the second terminal member, a flexible member surrounding said conductor and secured to the second terminal member with a gas-tight seal, and an insulating enclosing member joined to the first terminal member and to said flexible member with gas-tight seals to form an enclosure for the rectifier cell, and means for dissipating heat from at least one of said terminal members.

5. A rectifier device comprising a first terminal member, a semiconductor rectifier cell attached to said terminal member, a second terminal member attached to the other side of the rectifier cell, a flexible conductor attached to the second terminal member, a flexible metal bellows member surrounding said conductor and secured to the second terminal member with a gas-tight seal, an insulating member enclosing the bellows member, and means for attaching the insulating member to the bellows member and to the first terminal member with gas-tight seals to form an enclosure for the rectifier cell.

6. A rectifier device comprising a first terminal member, a semiconductor rectifier cell attached to said terminal member, a second terminal member attached to the other side of the rectifier cell, a flexible conductor attached to the second terminal member, a flexible metal bellows surrounding said conductor and having one end secured to the second terminal member with a gas-tight seal, a generally cylindrical metal member secured to the other end of the bellows with a gas-tight seal and attached to the flexible conductor, and a substantially rigid, insulating outer member surrounding the bellows and sealed to said cylindrical member and to the first terminal member to form a gas-tight enclosure for the rectifier cell.

7. A rectifier device comprising a first terminal member, a semiconductor rectifier cell attached to said terminal member, a second terminal member attached to the other side of the rectifier cell, a flexible conductor attached to the second terminal member, a flexible metal bellows surrounding said conductor and having one end secured to the second terminal member with a gas-tight seal, a generally cylindrical metal member secured to the other end of the bellows with a gas-tight seal and rigidly attached to the flexible conductor, and a substantially rigid, insulating outer member surrounding the bellows and sealed to said cylindrical member and to the first terminal member to form a gas-tight enclosure for the rectifier cell, and means for dissipating heat from the first terminal member.

References Cited in the file of this patent

UNITED STATES PATENTS

| | | |
|---|---|---|
| 1,799,854 | Levy | Apr. 7, 1931 |
| 2,383,735 | Ray | Aug. 28, 1945 |
| 2,725,505 | Webster et al. | Nov. 29, 1955 |
| 2,734,154 | Pankove | Feb. 7, 1956 |